(12) United States Patent
Chang et al.

(10) Patent No.: US 6,232,238 B1
(45) Date of Patent: May 15, 2001

(54) METHOD FOR PREVENTING CORROSION OF BONDING PAD ON A SURFACE OF A SEMICONDUCTOR WAFER

(75) Inventors: Yi-Chun Chang, Chung-Li; Jain-Hon Chen, Cha-yi, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/264,012

(22) Filed: Feb. 8, 1999

(51) Int. Cl.[7] ............... H01L 21/44; H01L 21/4763; H01L 21/302; C25F 1/00
(52) U.S. Cl. ............... 438/725; 438/612; 438/623; 438/624; 438/706; 134/1.2; 134/1.3
(58) Field of Search ................ 438/597, 598, 438/618, 612, 622–624, 636–646, 614, 617, 648, 652–656, 706–710, 712, 725, 743, 745, 778, 780, 783; 134/1.1–1.3

(56) References Cited

U.S. PATENT DOCUMENTS 5,412,868 * 5/1995 Nguyen et al. ............ 29/852
5,780,406 * 7/1998 Honda et al. ............ 510/175
5,792,672 * 8/1998 Chan et al. ............ 438/6

OTHER PUBLICATIONS

Wolf and Tauber, Silicon Processing for the VLSI Era, vol. 1, 1986, Lattice Press, pp 546–555.*
Wolf, Silicon Processing for the VLSI Era, vol. 2, 1990, Lattice Press, pp 273–275.*

* cited by examiner

Primary Examiner—John F. Niebling
Assistant Examiner—Ha Tran Nguyen
(74) Attorney, Agent, or Firm—Winston Hsu

(57) ABSTRACT

The present invention provides a method for preventing corrosion of a bonding pad resulting from residual polymers on a surface of a semiconductor wafer. The bonding pad is a metallic layer formed on the surface of the semiconductor wafer. The semiconductor wafer comprises an inorganic passivation layer positioned above the bonding pad, and an organic dielectric layer positioned above the inorganic passivation layer. The passivation and dielectric layers comprise a hole etched to the bonding pad. The method uses an organic solution to clean off residual polymers on the surface of the bonding pad inside the hole to prevent corrosion of the bonding pad.

9 Claims, 4 Drawing Sheets

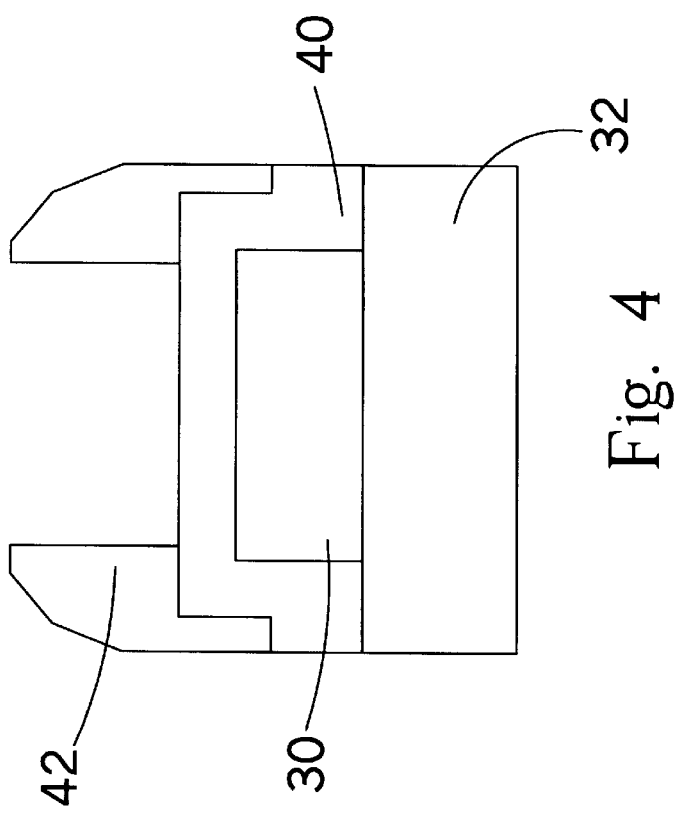
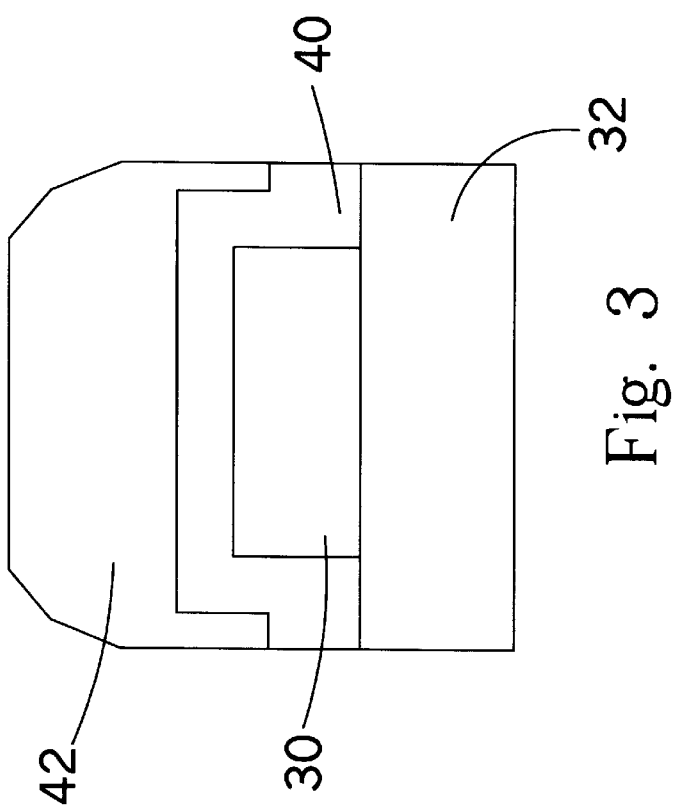

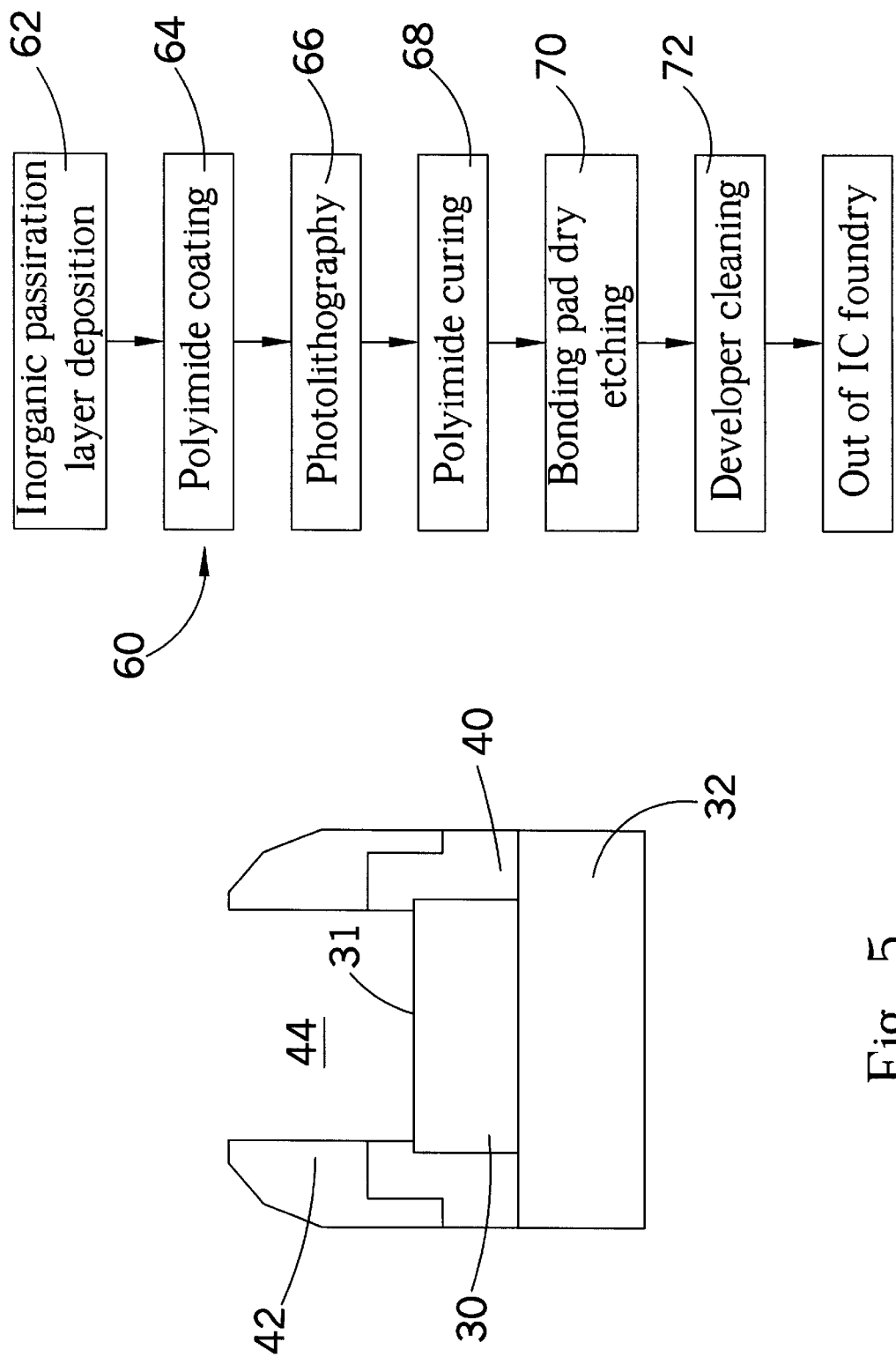

METHOD FOR PREVENTING CORROSION OF BONDING PAD ON A SURFACE OF A SEMICONDUCTOR WAFER

BACKGROUND OF THE INVENTION

1. Field of the Invention

The present invention relates to a method for preventing corrosion of a bonding pad on a surface of a semiconductor wafer, and more particularly, to a method for preventing corrosion of a bonding pad resulting from residual polymers on a surface of a semiconductor wafer.

2. Description of the Prior Art

In a semiconductor process, when all devices and metallic connections are formed on a semiconductor wafer, insulating layers are deposited or coated on a surface of the wafer to passivate their underlying integrated circuits, and a plurality of holes is then etched into the insulating layers so as to expose bonding pads formed on the surface of the wafer. The bonding pads are used to connect external devices through a wire bonding process to enable transmissions of electric signals from the wafer to external devices. Generally, the insulating layers and the plurality of holes are formed in an integrated circuit (IC) foundry, and the wafer is transported to an IC packaging factory for performing the wire bonding process. Because the wire bonding process is performed several days after forming the insulating layers and the holes, the bonding pads are exposed to open air for a long time causing a chemical reaction to occur. This chemical reaction will damage the bonding pads thus making the entire wafer abandoned.

Please refer to FIG. 1. FIG. 1 is a flowchart of a prior art process 10 of forming insulating layers and holes on bonding pads of a wafer. The process 10 is performed in an IC foundry in five steps when patterns are transferred onto the wafer: First, deposit a passivation layer on the wafer; second, coat a polyimide layer on the passivation layer; third, remove polyimide above the bonding pads through a photolithographic process; fourth, cure remaining polyimide on the wafer; fifth, perform a dry etching process in areas where the polyimide is removed to expose the bonding pads. When the process 10 is completed, the wafer is transported from the IC foundry to the IC packaging factory to perform the wire bonding process.

The dry etching process in the fifth step is performed by using a mixed gas comprising carbide, sulphide and fluoride, and commonly causes the mixed gas to generate polymers. The polymers will remain on the bonding pads when the dry etching process is completed, and will react with water vapors to generate acidic chemicals. Because the polyimide is organic photo-resist, using a solvent to clean off the polymers is not possible. Moreover, the acidic chemicals are sources of corrosion of the bonding pads. Thus, the bonding pads will become damaged and the entire wafer will be abandoned.

SUMMARY OF THE INVENTION

It is therefore a primary objective of the present invention to provide a method for preventing corrosion of a bonding pad resulting from residual polymers on the bonding pad to solve the above mentioned problems.

In a preferred embodiment, the present invention comprises a method for preventing corrosion of a bonding pad on a surface of a semiconductor wafer. The bonding pad is a metallic layer formed on the surface of the semiconductor wafer. The semiconductor wafer comprises an inorganic passivation layer positioned above the bonding pad, and an organic dielectric layer positioned above the passivation layer. The passivation and dielectric layers comprise a hole etched to the bonding pad. The method uses an organic solution to clean off residual polymers on the surface of the bonding pad inside the hole to prevent corrosion of the bonding pad.

It is an advantage of the present invention that the organic solution can clean off residual polymers on the surface of the bonding pad so that corrosion of the bonding pad can be prevented.

These and other objectives of the present invention will no doubt become obvious to those of ordinary skill in the art after reading the following detailed description of the preferred embodiment which is illustrated in the various figures and drawings.

BRIEF DESCRIPTION OF THE DRAWINGS

FIG. 3 is a sectional view showing passivation layers positioned above the bonding pad and the inner dielectric layer in FIG. 2.

FIG. 4 is a sectional view showing the organic passivation layer positioned above the bonding pad in FIG. 3 being removed.

FIG. 5 is a sectional view showing the inorganic passivation layer positioned above the bonding pad in FIG. 4 being removed.

FIG. 6 is a flowchart showing a process for preventing corrosion of the bonding pad in FIG. 2.

DETAILED DESCRIPTION OF THE PREFERRED EMBODIMENT

Figure 2:
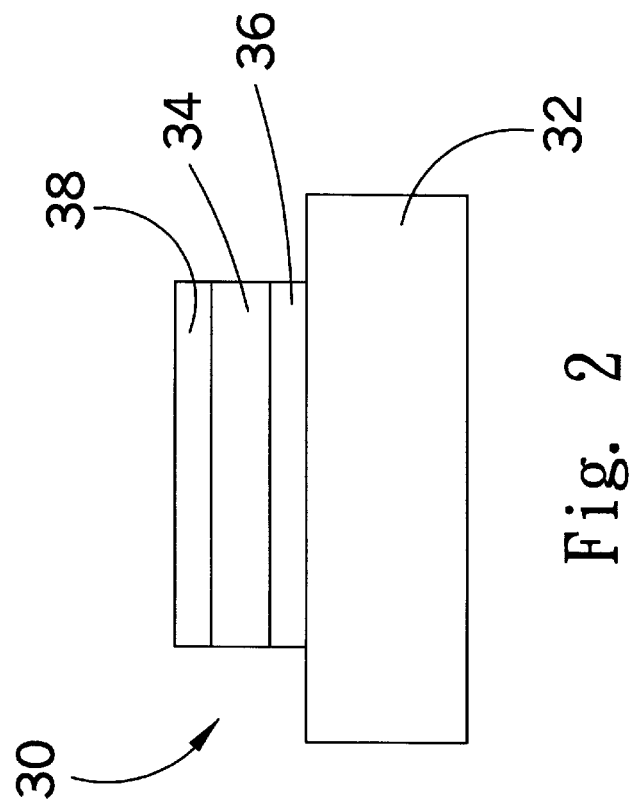
FIG. 2 is a sectional view of a bonding pad and an inner dielectric layer of a wafer according to the present invention.
Figure 1:
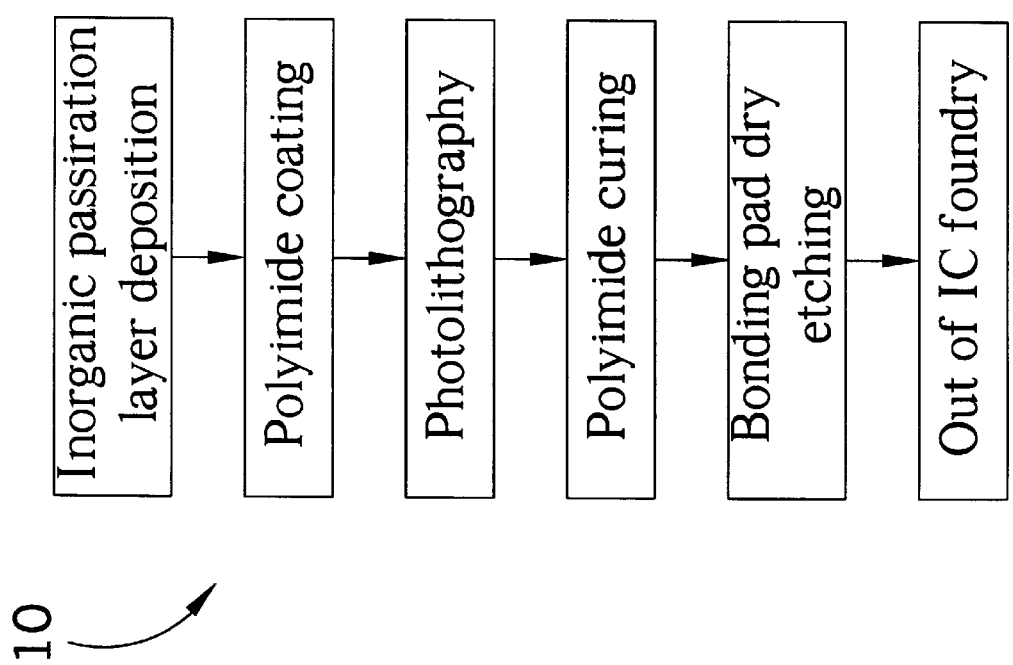
FIG. 1 is a flowchart of a prior art process of forming insulating layers and holes on bonding pads of a wafer.

The present invention proposes a method for preventing corrosion of a bonding pad on a surface of a semiconductor wafer. The method is performed when all patterns are transferred onto a wafer. Please refer to FIG. 2. FIG. 2 is a sectional view of a bonding pad 30 and an inner dielectric layer 32 of a wafer according to the present invention. The bonding pad 30 comprises an aluminum-copper alloy layer 34, an anti-reflective layer 38 formed of titanium nitride (TiN) positioned on a surface of the aluminum-copper alloy layer 34 and a titanium glue layer 36 positioned below the aluminum-copper alloy layer 34. The aluminum-copper alloy 34 is an alloy with over 95% aluminum by weight wherein copper can be replaced by other conductive materials. The inner dielectric layer 32 is formed by non-conductive materials such as silicon oxide and functions as inter-metal dielectrics or inter-layer dielectrics.

Please refer to FIG. 3. FIG. 3 is a sectional view showing passivation layers 40, 42 positioned above the bonding pad 30 and the inner dielectric layer 32. The inorganic passivation layer 40 is deposited through a chemical process onto the surface of the wafer. It prevents integrated circuits on the wafer from contacting vapor and passivating them from damages. The inorganic passivation layer 40 is formed by one or more dielectric layers. Each dielectric layer can be formed by using phosphosilicate glass (PSG), borophosphosilicate glass (BPSG), or silicon nitride (SiN). When the inorganic passivation layer 40 is formed, an organic passivation layer 42 is coated onto the inorganic passivation layer 40 by using polyimide. Please refer to FIG. 4. FIG. 4 is a sectional view showing the organic passivation layer 42 positioned above the bonding pad 30 being removed. When the passivation layers 40 and 42 are formed, polyimide positioned above the bonding pad 30 is removed through a photolithographic process, and a curing process is performed at 200~350° C. for 2~5 hours to enhance etching-resistance of the remaining organic passivation layer 42.

Please refer to FIG. 5. FIG. 5 is a sectional view showing the inorganic passivation layer 40 positioned above the bonding pad 30 being removed. When the curing process is performed, a dry etching process is performed to remove the inorganic passivation layer 40 in regions uncovered by the polyimide on the passivation layer 40. The dry etching process is performed by using plasma in a low air pressure environment filled with a mixed gas comprising sulfur hexafluoride ($SF_6$), fluoroform ($CHF_3$) and carbon tetrafluoride ($CF_4$). After performing the dry etching process, a hole 44 is formed to expose a surface 31 of the bonding pad 30, and acidic polymers including fluorocarbon ($CF_x$) will be formed on this surface 31.

After performing the dry etching process, an alkaline developer is applied to neutralize and clean off the acidic polymers on the surface 31 of the bonding pad 30 for preventing corrosion of the bonding pad 30. The alkaline developer comprises 2.38% tetramethyl ammonium hydroxide (TMAH). It can remove the polymers on the surface 31 and will not corrode the polyimide and the bonding pad 30, thus corrosion of the wafer produced by using this method is prevented.

Please refer to FIG. 6. FIG. 6 is a flowchart showing a process 60 for preventing corrosion of the bonding pad 30. The process 60 comprises the following six steps:

Step 62: deposit an inorganic passivation layer 40 on the patterned wafer;

Step 64: coat an organic passivation layer 42 formed of polyimide on the inorganic passivation layer 40;

Step 66: perform a photolithographic process to remove the polyimide on the bonding pad 30;

Step 68: perform a curing process to enhance etching-resistance of the remaining polyimide;

Step 70: perform a dry etching process to remove the inorganic passivation layer 40 on the bonding pad 30 and form a hole 44 to expose the bonding pad 30;

Step 72: use a 2.38% TMAH developer to clean off polymers on the bonding pad 30.

Results of composition analyses of the surface of the wafer performed by using an Auger electron spectrometer show that main constituents of the polymers such as carbon and fluorine have been reduced when compared to a wafer that has not undergone cleaning with the developer. Also, a rapid corrosion test is performed on the wafer at 85° C. and 85% relative humidity for 8 days, and the Auger electron spectrometer again shows that the carbon and fluorine content has been reduced. Moreover, the bonding pad 30 is not corroded, thus the bonding pad 30 can remain clean to improve yield of the IC packaging.

Figure 7:
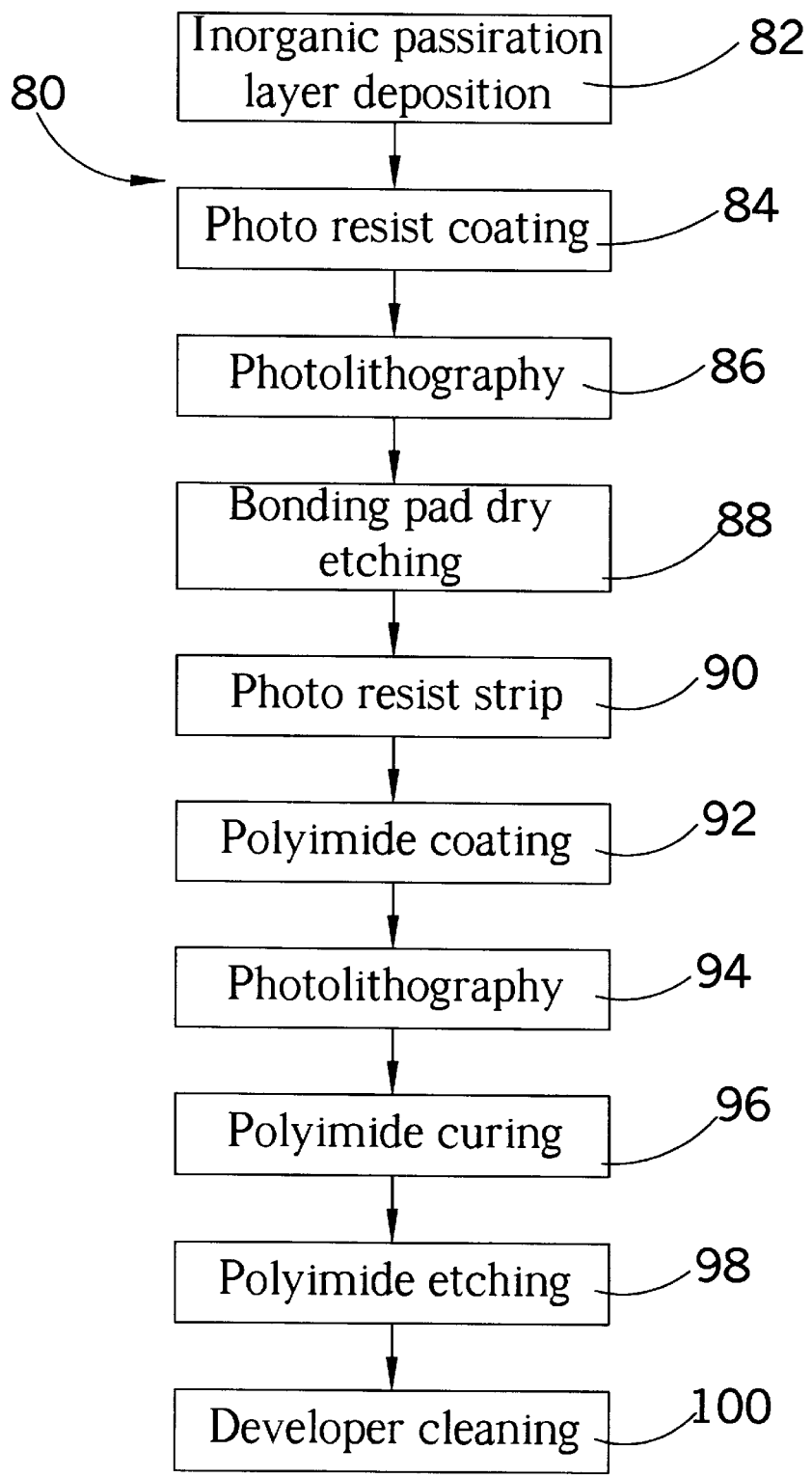
FIG. 7 is a flowchart showing another process for preventing corrosion of the bonding pad in FIG. 2.

Please refer to FIG. 7. FIG. 7 is a flowchart showing another process 80 for preventing corrosion of the bonding pad 30. The process 80 comprises the following steps:

Step 82: deposit an inorganic passivation layer 40 on the patterned wafer;

Step 84: coat a photo-resist layer on the inorganic passivation layer 40;

Step 86: perform a photolithographic process to remove the photo-resist layer on the bonding pad 30;

Step 88: perform a dry etching process to remove the inorganic passivation layer 40 on the bonding pad 30;

Step 90: strip the photo-resist layer;

Step 92: coat a polyimide dielectric layer 42;

Step 94: perform a photolithographic process to remove polyimide on the bonding pad 30 to form a hole 44;

Step 96: perform a curing process to enhance etching-resistance of the remaining polyimide dielectric layer 42;

Step 98: perform a polyimide etching for a short time to remove the polyimide on the bonding pad 30 completely;

Step 100: use a 2.38% TMAH developer to clean off polymers formed on the surface 31 of the bonding pad 30.

The difference between the processes 60 and 70 is that the latter involves two photolithographic processes. Therefore, the cost of the process 80 is higher than that of the process 60. However, most polymers generated in the dry etching process of step 88 are removed along with stripping of the photo-resist layer in step 90. The polyimide etching process of step 98 will only generate a small amount of polymers which can be easily removed by the 2.38% TMAH developer in step 100. Therefore, the process 80 provides a better alternative to prevent corrosion of the bonding pad 30.

In contrast to the prior art process 10, when the dry etching process is performed, the process 60, 80 uses the developer to clean off residual polymers on the surface of the bonding pad inside the hole of the wafer. Therefore, corrosion on the surface of the bonding pad can be prevented. The quality of the IC packaging can be ensured and the yield of the wafer can be increased.

Those skilled in the art will readily observe that numerous modifications and alterations of the propeller may be made while retaining the teachings of the invention. Accordingly, the above disclosure should be construed as limited only by the metes and bounds of the appended claims.

What is claimed is:

1. A method for preventing corrosion of a bonding pad on a surface of a semiconductor wafer, the bonding pad being a metallic layer formed on the surface of the semiconductor wafer, the semiconductor wafer comprising a passivation layer positioned above the bonding pad, and a dielectric layer positioned above the passivation layer, the passivation and dielectric layers comprising a hole etched to the bonding pad, the method comprising:

using an organic solution to clean off residual polymers on the surface of the bonding pad inside the hole to prevent corrosion of the bonding pad, wherein the organic solution is an alkaline developer comprising 2.38% tetramethyl ammonium hydroxide (TMAH) for removing the residual polymers, and the residual polymers left on the surface of the bonding pad inside the hole comprise CF material.

2. The method of claim 1 wherein the dielectric layer is formed by using polyimide.

3. The method of claim 1 wherein the hole is formed by using a dry etching method.

4. The method of claim 3 wherein the dry etching method is performed by using plasma in a low air pressure environment filled with a mixed gas comprising sulfur hexafluoride ($SF_6$), fluoroform ($CHF_3$) and carbon tetrafluoride ($CF_4$).

5. The method of claim 1 wherein the bonding pad is formed by using aluminum, copper or aluminum alloy.

6. The method of claim 5 wherein the aluminum alloy is an aluminum-copper alloy with over 95% aluminum by weight.

7. The method of claim 1 wherein the bonding pad comprises a titanium (Ti) glue layer on its bottom, an aluminum alloy layer above the glue layer, and a titanium nitride (TiN) anti-reflective layer on the surface of the aluminum alloy layer.

8. The method of claim 1 wherein the passivation layer is formed by one or more dielectric layers for passivating integrated circuits contained in the semiconductor wafer.

9. The method of claim 8 wherein each dielectric layer can be formed by using phosphosilicate glass (PSG), borophosphosilicate glass (BPSG), or silicon nitride (SiN).

* * * * *